United States Patent
Frost et al.

(10) Patent No.: US 7,219,978 B2
(45) Date of Patent: May 22, 2007

(54) INK JET BANK SUBSTRATES WITH CHANNELS

(75) Inventors: Tobias Frost, Burglengenfeld (DE); Matthias Stoessel, Mannheim (DE)

(73) Assignee: Osram Opto Semiconductors GmbH, Regensburg (DE)

( * ) Notice: Subject to any disclaimer, the term of this patent is extended or adjusted under 35 U.S.C. 154(b) by 319 days.

(21) Appl. No.: 10/298,731

(22) Filed: Nov. 18, 2002

(65) Prior Publication Data

US 2004/0202819 A1    Oct. 14, 2004

(51) Int. Cl.
    *B41J 2/135*     (2006.01)
(52) U.S. Cl. ...................................... 347/45
(58) Field of Classification Search ............ 347/45, 347/105, 106, 68, 76; 257/40, 89, 98, 100; 313/486, 503, 511, 521; 315/169.1, 169; 345/32, 82; 438/30, 34; 428/690, 917; 385/15–18
    See application file for complete search history.

(56) References Cited

U.S. PATENT DOCUMENTS

| | | | | |
|---|---|---|---|---|
| 5,695,833 A * | 12/1997 | Bok et al. | ...... | 427/600 |
| 5,699,462 A * | 12/1997 | Fouquet et al. | ...... | 385/18 |
| 5,747,931 A * | 5/1998 | Riddle et al. | ...... | 313/581 |
| 6,057,647 A * | 5/2000 | Kurosawa et al. | ...... | 315/169.3 |
| 6,194,837 B1 | 2/2001 | Ozawa | ...... | 315/169.1 |
| 6,590,346 B1 * | 7/2003 | Hadley et al. | ...... | 315/169.3 |
| 6,656,611 B2 * | 12/2003 | Tai et al. | ...... | 428/690 |
| 6,661,029 B1 * | 12/2003 | Duggal | ...... | 257/89 |
| 6,715,871 B2 * | 4/2004 | Hashimoto et al. | ...... | 347/102 |

* cited by examiner

*Primary Examiner*—An H. Do
(74) *Attorney, Agent, or Firm*—Fish & Richardson P.C.

(57) ABSTRACT

A substrate with banks having end channels is provided to advantageously allow excess fluid collecting on one part of the substrate to flow to another part of the substrate. An excess of fluid collecting in a particular area of the substrate may flow to an area of the substrate where it would not interfere with the manufacturing process. The end channels may be modified with wave breakers that act as buffers to redirect excess fluid and/or with capillary-force homogeneity enhancers that pull excess fluid away from other parts of the substrate. The end channels may also contain line-end reservoirs that provide additional room for excess fluid to collect.

23 Claims, 2 Drawing Sheets

INK JET BANK SUBSTRATES WITH CHANNELS

BACKGROUND OF THE INVENTION

1. Field of the Invention

The present invention relates to substrates for ink-jet printing. More particularly, the present invention relates to bank substrates for use in the deposition of ink-jet materials, such as those used in organic electronic devices such as organic transistors and integrated circuits, as well as for organic light-emitting devices (OLEDs).

2. Description of Related Art

One conventional type of printer forms characters and images on a medium or substrate, such as paper, by expelling droplets of ink, often comprising organic material, in a controlled fashion so that the droplets land on the medium in a pattern. Such a printer can be conceptualized as a mechanism for moving and placing the medium in a position such that ink droplets can be placed on the medium, a printing cartridge which controls the flow of ink and expels droplets of ink to the medium, and appropriate control hardware and software. A conventional print cartridge for an inkjet type printer comprises an ink containment device and a fingernail-sized apparatus, commonly known as a print head, which heats and expels ink droplets in a controlled fashion. The print cartridge may contain a storage vessel for ink, or the storage vessel may be separate from the print head. Other conventional inkjet type printers use piezo elements that can vary the ink chamber volume through use of the piezo-electric effect to expel ink droplets in a controlled fashion.

Applications of ink-jet printers have moved beyond the conventional creation of characters and images for viewing by people to the creation of circuits and displays, for example organic display panels.

Ink-jet printing is being used or developed as a tool to deposit organic materials in a patterned manner onto substrate to create organic, or partially organic, electronic devices such as, by example only, transistors (such as organic field-effect transistors) and integrated circuits, conductive via holes or traces, organic light-emitting devices (OLEDs). Helpful background material may be found in U.S. patent application Ser. No. 10/214,024, entitled "Drop Volume Measurement and Control for Ink Jet Printing", filed on Aug. 7, 2002, and incorporated herein by reference.

The types of substrates used for ink-jet printing depends on the particular application. Some types of substrates used, by way of example only, are glass substrates, plastic substrates (such as polyethylene terephthalate, polyethylene naphthalate, polymide, polycarbonate), metal foils, ceramic substrates, laminated glass, and thin flexible glass. Some applications for substrates, by way of example only, are substrates for thin film transistors (TFTs), hybrid organic/inorganic TFTs, alpha-numeric or passive-matrix or active-matrix OLEDs or combined TFT/OLED devices.

A challenge with the techniques described above for creating printed film is maintaining the desired uniformity and quality of the resulting components, such as printed areas, printed segments, printed lines, printed pixels, printed traces, and printed via-holes, by way of example only.

The droplets striking the substrate often need to be contained in walls (such as troughs or banks, by way of example only) in or on the substrate to prevent spreading. However, excess fluid may collect near the walls, due to adhesion or simply because too many or too large droplets were deposited on the substrate. This excess fluid, or "flooding", can mean that once the droplet(s) dries, ink remains beyond the boundary of the wall.

Additionally, droplets emitted by piezo-electric printing devices sometimes require more settling time, which means that the printing must start earlier. The misalignment and excess build-up of droplets can cause even more flooding. Excessive flooding may cause problems such as short circuits and current leaks; it may also make it more difficult to seal the device being manufactured.

For most applications, the solution should create a uniform film on the substrate which means, in most cases, that the solution must dry in a uniform manner as it is deposited. By way of example only, the uniformity of drying can affect, in the case of OLEDs, uniformity, lifetime, efficiency, and color gamut. Maintaining uniformity is difficult because very often solution drops show so-called "coffee stain" drying profiles. Capillary flow causes ring stains from dried liquid drops, whereby within a printed drop (or line or area) fluid-dynamic effects cause the edges of the drop (or line or area) to have a substantially higher concentration of solute than the center. This is often not acceptable for device performance. Though this effect can be mitigated by careful choice of the drying ambient (such as temperature and/or atmospheric pressure, by way of example only) and/or the choice of solvents (adjusting the boiling point, solvent strength, solvent mix, and/or surface energy, by way of example only), disadvantageously other printing factors are adversely affected substantially enough to degrade printing quality. For example, though coffee-stain types of drying effects can be reduced by using a highly viscous solvent and/or by using solute that is poorly dissolved in the solution (and therefore precipitates or "crashes out" of the solution), a highly-viscous solution or poorly dissolved solution can be very problematic for the printing or dispensing process itself (causing, by way of example only, nozzle clogging and/or inaccurate drop firing or dispensing).

SUMMARY OF THE INVENTION

It is therefore an object of the present invention to provide a substrate with banks that have end channels to drain excess liquid, improve the homogeneity for drying liquid drops, and/or collect liquid during piezo stabilization.

It is another object of the present invention to provide a substrate with banks that have end channels with wave breakers to avoid mixing of different solutions from neighboring areas.

It is yet another object of the present invention to provide a substrate with banks that have end channels with capillary-force homogeneity enhancers to improve the homogeneity for drying liquid drops using capillary force.

It is yet another object of the present invention to provide a substrate with banks that have staggered line-end reservoirs to drain excess liquid, improve the homogeneity for drying liquid drops, and/or collect liquid during piezo stabilization.

A substrate with banks having end channels is provided to advantageously allow excess fluid collecting on one part of the substrate to flow to another part of the substrate. This prevents or alleviates the detrimental effects of too much fluid from collecting in a particular area of the substrate and/or the detrimental effects of the fluid flowing to an area of the substrate where it would interfere with the manufacturing process. Advantageously, the end channels may be modified with wave breakers that act as buffers to redirect excess fluid and/or with capillary-force homogeneity enhancers that pull excess fluid away from other parts of the substrate. Advantageously, end channels may contain line-end reservoirs that provide additional room for excess fluid to collect.

DETAILED DESCRIPTION

In a preferred embodiment, the invention is described in an implementation for the application of circuit and/or display components on substrates. The invention may be, in other preferred embodiments, implemented for other purposes, such as the application of ink on paper or other medium for the purpose of creating characters and/or images for viewing by way of example only.

Figure 1:
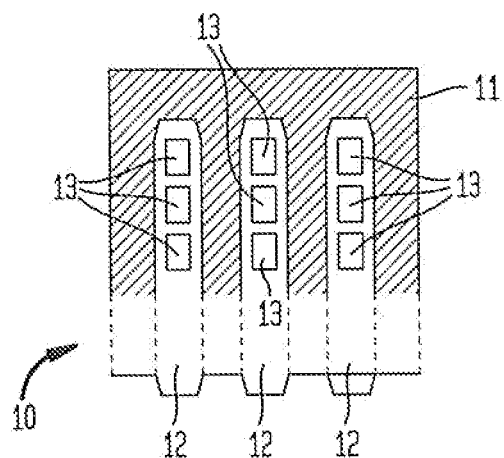
FIG. 1 is a diagram showing the layout of a standard structure for the manufacture of pixels in a display.

With reference to FIG. 1, the layout of a standard structure for the manufacture of an OLED display is shown. Substrate 10, which is be made of polyethylene terephthalate by way of example only, is covered with an insulating bank layer 11, which is made of another plastic by way of example only. Lines 12 are exposed areas in bank layer 11 that are adapted to hold fluid formed by the application of droplets (not shown). A plurality of ITO pixels 13 are situated within lines 12 and are adapted to provide luminescent lighting when the manufacture of the display is completed.

Figure 2:
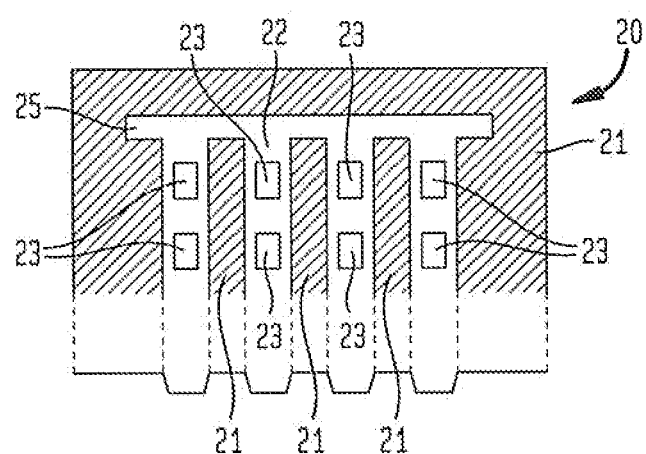
FIG. 2 is a diagram showing an example of a preferred embodiment of the invention having end channels.

With reference to FIG. 2, a preferred embodiment of the invention is shown. Substrate 20 is covered with an insulating bank layer 21 and lines 22 are exposed areas in bank layer 21 with pixels 23 situated within them. End channel 25 provides a route for fluid to flow. When droplets are applied to lines 22, fluid that otherwise would spill over onto bank layer 21 is channeled into end channel 25. Additionally, while the droplets dry the movement of excess fluid into end channel 25 helps to alleviate the coffee-stain effect. Droplets that are misaligned and land on the border of bank layer 21 (for example, while a piezo-electric printing device, which is not shown, is stabilizing) also may be drawn into end channel 25. The result is an improved drying profile.

Figure 3:
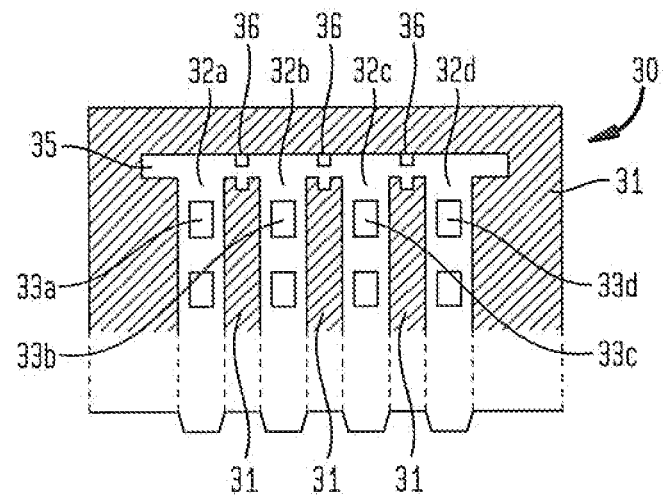
FIG. 3 is a diagram showing an example of a preferred embodiment of the invention wherein end channels are modified with wave breakers.

With reference to FIG. 3, another preferred embodiment of the invention is shown which helps prevent different fluids from mixing. Substrate 30 is covered with an insulating bank layer 31 and lines 32a, 32b, 32c, 32d are exposed areas in bank layer 31 with colored pixels 33a, 33b, 33c, 33d situated within them, respectively. In the example shown, pixels 33a, 33d are red, pixel 33b is green, and pixel 33c is blue. End channel 35 provides a route for fluid to flow. When droplets are applied to lines 32, fluid that otherwise would spill over onto bank layer 31 is channeled into end channel 35. Wave breakers 36 are situated within end channel 35 to prevent the fluid from lines 32a, 32b, 32c, 32d from mixing together. The embodiment shown in FIG. 3, in addition to having the effects of the embodiment shown in FIG. 2, prevents the mixing (e.g., color crosstalk) between neighboring channels. Thus, for example, red ink is prevented from spilling into the green line 32b.

Figure 4:
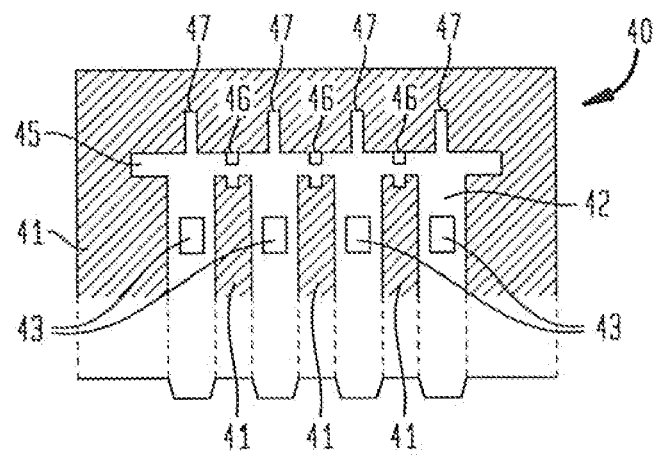
FIG. 4 is a diagram showing an example of a preferred embodiment of the invention wherein end channels are modified with capillary-force homogeneity enhancers.

With reference to FIG. 4, another preferred embodiment of the invention is shown which helps draw fluid from end channels. Substrate 40 is covered with an insulating bank layer 41 and lines 42 are exposed areas in bank layer 41 with pixels 43 situated within them. End channel 45 with wave breakers 46 provides a route for fluid to flow. Additionally, capillary-force homogeneity enhancers 47, which are, for example, narrow conduits in insulating bank layer 41, take advantage of adhesion and cohesion (similar in principle to water moving up the xylem in a tree) to force fluid to be drawn off from end channel 45. This improves homogeneity of the drying profile in the end channel area.

Figure 5:
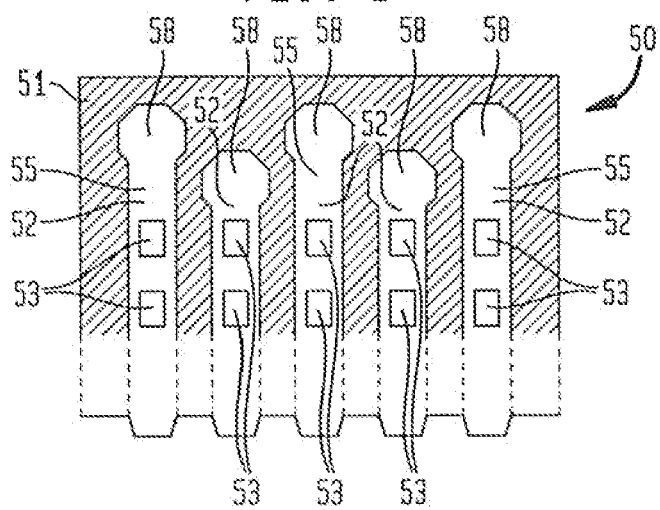
FIG. 5 is a diagram showing an example of a preferred embodiment of the invention wherein end channels have staggered line-end reservoirs.

With reference to FIG. 5, another preferred embodiment of the invention is shown which helps draw more fluid from lines. Substrate 50 is covered with an insulating bank layer 51 and lines 52 are exposed areas in bank layer 51 with pixels 53 situated within them. End channels 55 with reservoirs 58 provide a route for fluid to flow. Reservoirs 58 provide space for an additional volume of fluid to collect. This may allow excess fluid to be drained off, cause an improvement in homogeneity of the drying profile in the end channel area, and collect fluid during stabilization of a piezo-electric printing device.

Figure 6:
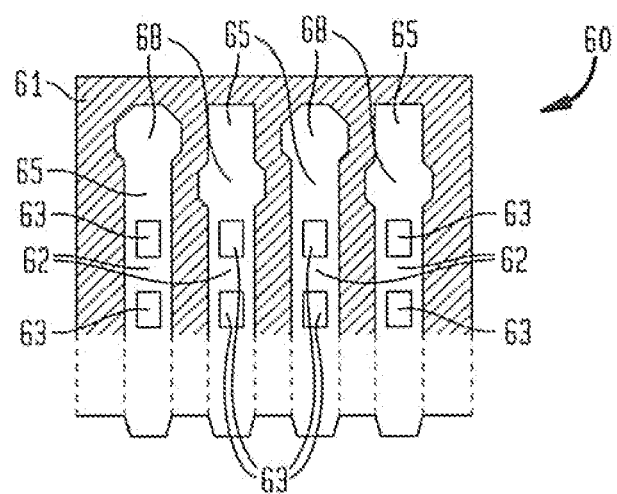
FIG. 6 is a diagram showing an example of a preferred embodiment of the invention wherein end channels of substantially the same length have staggered line-end reservoirs.

With reference to FIG. 6, another preferred embodiment of the invention is shown which helps draw substantially the same amount of fluid from lines having substantially the same amount of fluid. Substrate 60 is covered with an insulating bank layer 61 and lines 62 are exposed areas in bank layer 61 with pixels 63 situated within them. End channels 65 with reservoirs 68 provide a route for fluid to flow. End channels 65 are of substantially the same length, which improves homogeneity across lines 62.

While the invention has been described in terms of preferred embodiments, those skilled in the art will recognize that the invention can be practiced with modification within the spirit and scope of the appended claims.

We claim:

1. A substrate assembly comprising:
   a substrate;
   a plurality of pixels on said substrate, wherein each pixel is defined at least in part by conductive material; and
   an insulating bank layer on the substrate, wherein said insulating bank layer has a plurality of grooves that expose a portion of said substrate and the plurality of pixels are within the grooves, wherein said insulating bank layer has at least one channel connected to said plurality of grooves to collect fluid applied to said plurality of grooves.

2. The substrate assembly of claim 1, wherein said insulating bank layer has at least one wave breaker situated in said at least one channel.

3. The substrate assembly of claim 1, wherein said insulating bank layer has at least one capillary-force homogeneity enhancer connected to said at least one channel.

4. The substrate assembly of claim 1, wherein said at least one channel has a reservoir for collecting fluid.

5. The substrate assembly of claim 1, wherein said at least one channel is at least two channels of substantially the same length, and wherein each of said two channels has a reservoir for collecting fluid.

6. The substrate assembly of claim 1, wherein the grooves are parallel to one another.

7. The substrate assembly of claim 1, wherein the conductive material is ITO.

8. The substrate assembly of claim 1, wherein the channel is perpendicular to the plurality of grooves.

9. The substrate assembly of claim 1, wherein the channel is an end channel.

10. The assembly of claim 1, wherein at least two pixels of the plurality of pixels are within each groove.

11. A method for manufacturing an electrically active organic component comprising the steps of:
   forming in an insulating bank layer of a substrate at least one groove that exposes a portion of said substrate;
   forming in said insulating bank layer at least one channel connected to said at least one groove that collects fluid applied to said at least one groove; and
   emitting at least one droplet from a print head into said at least one groove to form at least a part of said electrically active organic component.

12. The method for manufacturing an electrically active organic component of claim 11, wherein:
   said electrically active organic component is a pixel in a display.

13. The method for manufacturing an electrically active organic component of claim 11, wherein:
   said insulating bank layer has at least one wave breaker situated in said at least one channel.

14. The method for manufacturing an electrically active organic component of claim 11, wherein:
   said insulating bank layer has at least one capillary-force homogeneity enhancer connected to said at least one channel.

15. The method for manufacturing an electrically active organic component of claim 11, wherein:
   said at least one channel has a reservoir for collecting fluid.

16. The method for manufacturing an electrically active organic component of claim 11, wherein:
   said at least one channel is at least two channels of substantially the same length, and wherein each of said two channels has a reservoir for collecting fluid.

17. The method of claim 11, wherein forming in said insulating bank layer at least one channel connected to said at least one groove that collects fluid includes forming the at least one channel perpendicular to the at least one groove.

18. The method of claim 11, further comprising forming a pixel area on said substrate, including forming a conductive material on the substrate, wherein the step of forming in the insulating bank layer at least one groove includes forming the groove so that the pixel area is within the groove.

19. The method of claim 18, wherein forming the conductive material includes applying ITO on the substrate.

20. The method of claim 11, wherein forming in said insulating bank layer at least one channel includes forming a channel that is at an end of the at least one groove to form an end channel.

21. The method of claim 11, wherein the step of emitting at least one droplet from a print head into said at least one groove forms at least two pixels within the groove.

22. An electrically active organic component comprising a substrate assembly, wherein the substrate assembly comprises:
   a substrate;
   a plurality of active pixels on said substrate; and
   an insulating bank layer on the substrate, wherein said insulating bank layer has a plurality of grooves that expose a portion of said substrate and the plurality of active pixels are within the grooves and said insulating layer has at least one channel connected to said plurality of grooves.

23. The component of claim 22, wherein at least two pixels of the plurality of active pixels are within each groove.

* * * * *